FLUID LOGIC CIRCUIT MECHANISM

Filed Aug. 5, 1966 2 Sheets-Sheet 1

INVENTOR
KARL A. BRANDENBERG
BY Bair, Freeman & Molinare ATTORNEYS.

FLUID LOGIC CIRCUIT MECHANISM

INVENTOR
KARL A. BRANDENBERG
BY Bair, Freeman & Molinare
ATTORNEYS

United States Patent Office 3,407,834

Patented Oct. 29, 1968

3,407,834

FLUID LOGIC CIRCUIT MECHANISM

Karl A. Brandenberg, 25564 Spur Drive,
Hayward, Calif. 94541

Continuation-in-part of application Ser. No. 479,758 Aug. 16, 1965. This application Aug. 5, 1966, Ser. No. 570,663
8 Claims. (Cl. 137—271)

ABSTRACT OF THE DISCLOSURE

Mechanism for connecting fluid logic circuits comprising a base plate, a circuit control module and a cover plate which are stacked together and adapted for the mounting thereon of fluid logic valve units, porting blocks and the like. The base plate has a full pattern of perforations and so does the circuit control module, the latter being capable of having slots cut therein from one of its perforations to another to provide lateral fluid conducting slots defined by the sides of the slots and those surfaces of the base plate and the cover plate next to the circuit control module, thus providing a simple and inexpensive means for effecting fluid connections between ports of the various valve units and porting blocks.

The present application is a continuation-in-part of my copending application, Ser. No. 479,758, filed Aug. 16, 1965.

This invention relates to a fluid logic circuit mechanism which provides a system that allows fluid logic circuits such as those powered with compressed air or the like to be built from components without the use of tubing or piping except that which delivers fluid to the mechanism or carries fluid away from the mechanisms, all fluid interconnections on a "circuit board" on which a plurality of valve units and circuit porting blocks are mounted being accomplished in the construction of the board itself.

One object of the invention is to provide a circuit board which comprises a base plate, a circuit module of gasket-like character, and a cover plate, any desired number of valve units and circuit porting blocks being mounted on the assembly of the three elements just enumerated, the circuit module being designed as a dual function element to-wit: the usual sealing function and an interconnecting fluid circuit function. As such, the circuit module for each individual circuit board-valve unit-porting block assembly provides the interconnecting passageways between the various valve units and porting blocks mounted on the base plate.

Another object is to provide an assembly of base plate, circuit module and cover plate with a plurality of valve and porting block units held against the base plate by clamp means extending therefrom and through the base plate, circuit module and cover plate so that all of the elements just enumerated are held assembled in stacked relation.

Another object is to provide the circuit module of gasket-like material and to provide certain ring seals so that the base plate, circuit module, cover plate, valve units and porting blocks are held assembled in fluid tight relation.

Still another object is to provide a fluid logic circuit mechanism in which there is the possibility of various combinations to give the necessary versatility in fluid logic functions comparable to electronic logic functions and wherein the valve units may operate from an air supply at 20 p.s.i.g. to 150 p.s.i.g. which is usually available in factories and the like.

A further object is to provide a circuit board-valve unit system for industrial applications such as are required in automation, and to provide such system simplified in respect to installations where presently logic functions are performed with conventional valves piped together, or where logic functions are accomplished electrically with switches and relays and then converted into pneumatic signals. Other applications are possible in numerical control because all logic functions required for comparator circuits can be performed with the logic elements of the herein disclosed mechanism.

Still a further object is to provide an arrangement in which mounting the valve elements on a circuit board of the proper design, and particularly with respect to individual design of the circuit module and circuit board, connects them automatically to the circuit and sealing is assured by the force of clamp screws for each valve unit and porting block.

An additional object is to provide a fluid logic circuit mechanism wherein the logic elements can be mounted on a circuit board as well as to sub-bases which allow marketing of assemblies as ported valves, as manifolded valve groups and as complete logic functions.

Another additional object is to provide a fluid logic mechanism in which fluid circuit boards may be designed for combining valve units for logic functions such as OR, AND, NOT, NOR, NAND, MEMORY, FLIP-FLOP, DIFFERENTIATOR, TIME DELAY and the like, and wherein properly designed valve units for each of the logic functions may be mounted on a circuit board and the circuit module designed in relation thereto for interconnecting the proper passageways in the desired sequence of operation of the valve units, circuit porting blocks being provided to which outside piping may be connected as by copper or plastic tubes and fittings therefor.

A further additional object is to provide a fluid logic circuit mechanism comprising a base plate, a circuit module against the base plate, and a cover plate against the circuit module wherein the base plate has a recurring pattern of fluid connection perforations for fluid passageways of fluid logic valve units and circuit porting blocks adapted to be mounted on the base plate in alignment with selected ones of such patterns, the circuit module also having a recurring pattern of fluid connection perforations aligned with the base plate perforations and having fluid conducting slots connecting some of the fluid connection perforations of the circuit module with each other to serve as lateral fluid connections between various of the base plate perforations, the recurring pattern of fluid connection perforations permitting the mounting of porting blocks and various types of valve units at different selected positions on the surface of the base plate, the pattern being repeated in one direction and also laterally of such direction if desired.

Still a further additional object is to provide an assembly of metal base and cover plates, and a resilient or gasket-like circuit module, wherein the base plate may be relatively thin as it serves merely the purpose of a seal plate for the valve units and circuit porting blocks in relation to the circuit module whereas the cover plate is relatively thick to resist distortion upon the tightening of clamp screws extending from the valve units and porting blocks through the base plate, circuit module and cover plate.

With these and other objects in view, my invention consists in the construction, arrangement and combination of the various parts of my fluid logic circuit mechanisms, whereby the objects above contemplated are attained, as hereinafter more fully set forth, pointed out in my claims and illustrated in detail on the accompanying drawings, wherein:

Figure 2:
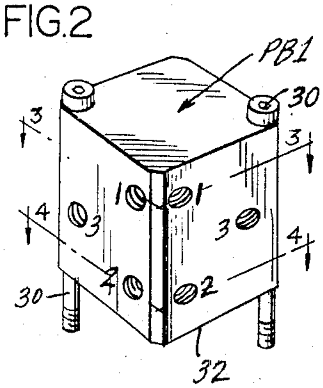
FIG. 2 is a perspective view of a circuit porting block with side porting.
Figure 3:
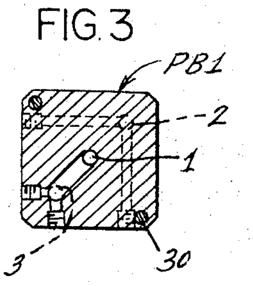
Figure 4:
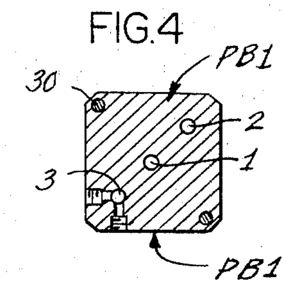
Figure 5:
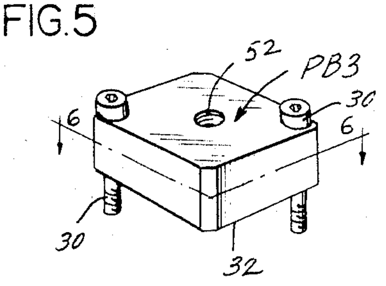
Figure 7:
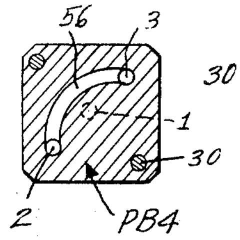
Figure 8:
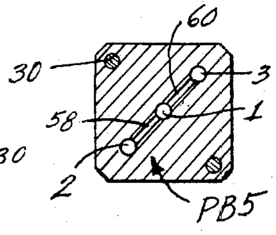
Figure 6:
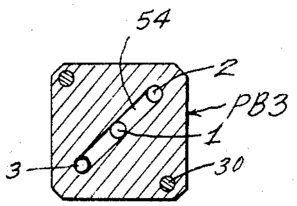
Figure 11:
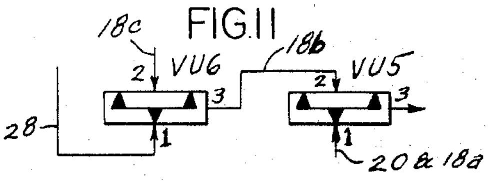
Figures 9, 10:
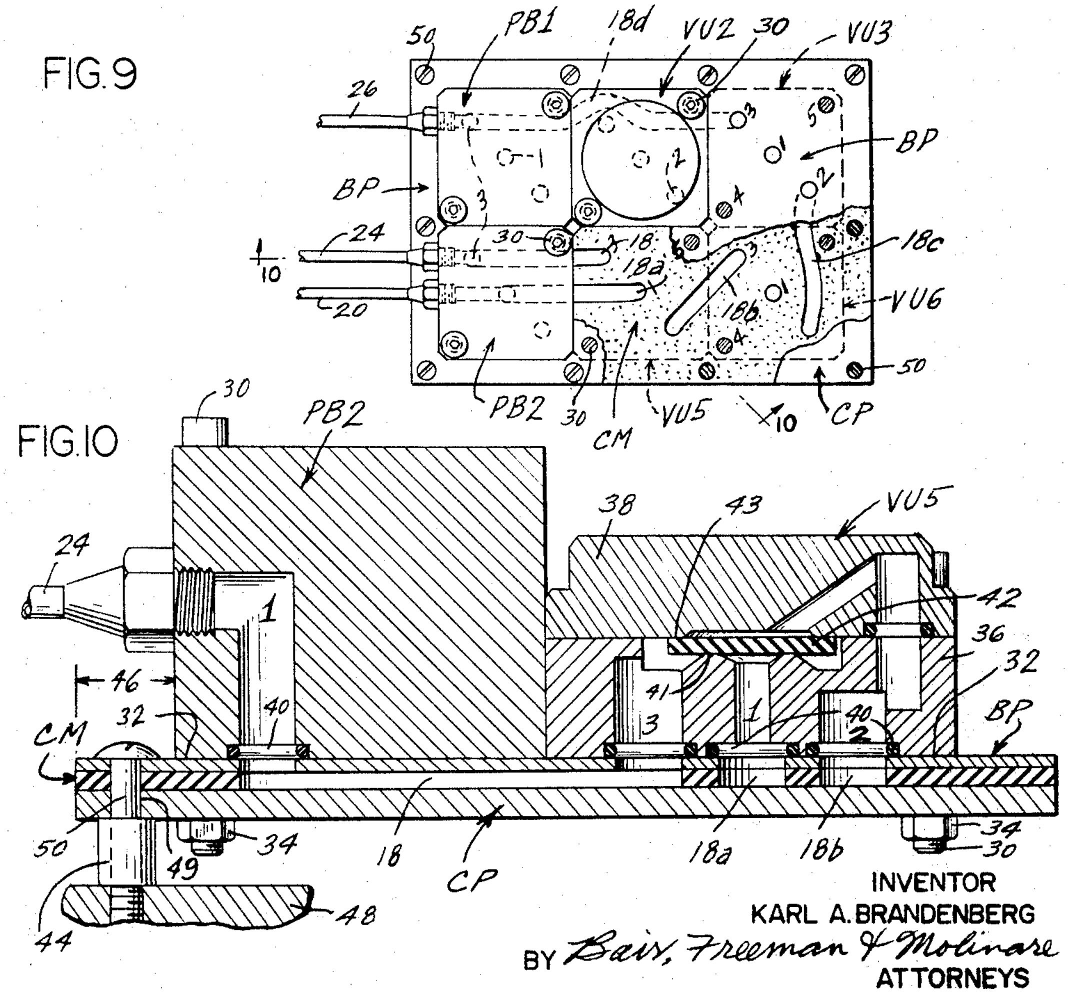

FIGS. 3 and 4 are sectional views thereof on the lines 3—3 and 4—4 respectively of FIG. 2;

FIG. 5 is a perspective view of a circuit porting block with top porting;

FIG. 6 is a sectional view thereof on the line 6—6 of FIG. 5;

FIG. 7 is a sectional view similar to FIG. 6 showing a circuit crossover block;

FIG. 8 is a sectional view similar to FIG. 6 showing a circuit orifice block;

FIG. 9 is a plan view of a 4-valve assembly having two porting blocks (the same as FIG. 1) wherein three of the valve units are removed and portions of a base plate, a circuit module and a cover plate are each shown in plan view, a portion of the base plate being broken away to show the circuit module and circuit slots thereof, and a portion of the circuit module being broken away to show the cover plate;

FIG. 10 is an enlarged vertical sectional view on the line 10—10 of FIG. 9 showing the mounting of a valve unit on the circuit board assembly and the connection of outside piping thereto through a circuit porting block; and FIG. 11 is a diagrammatic view to show symbolically a pair of the valve units which are interconnected with each other.

On the accompanying drawings, I have used the reference character BP to indicate a base plate, CM a control module, and CP a cover plate of my circuit board assembly. The plates may be of any suitable metal or plastic, and the circuit module of rubber-like material for sealing compressibility and ease of the cutting of lateral passageways therein as required. Preferably, the circuit module is formed of a material compressing cork particles or the like, covered with neoprene, Buna N, or polychloroprene, to avoid excessive lateral displacement into the ports and passageways of the assembly as experienced with rubber or rubber-like material alone.

Figure 1:
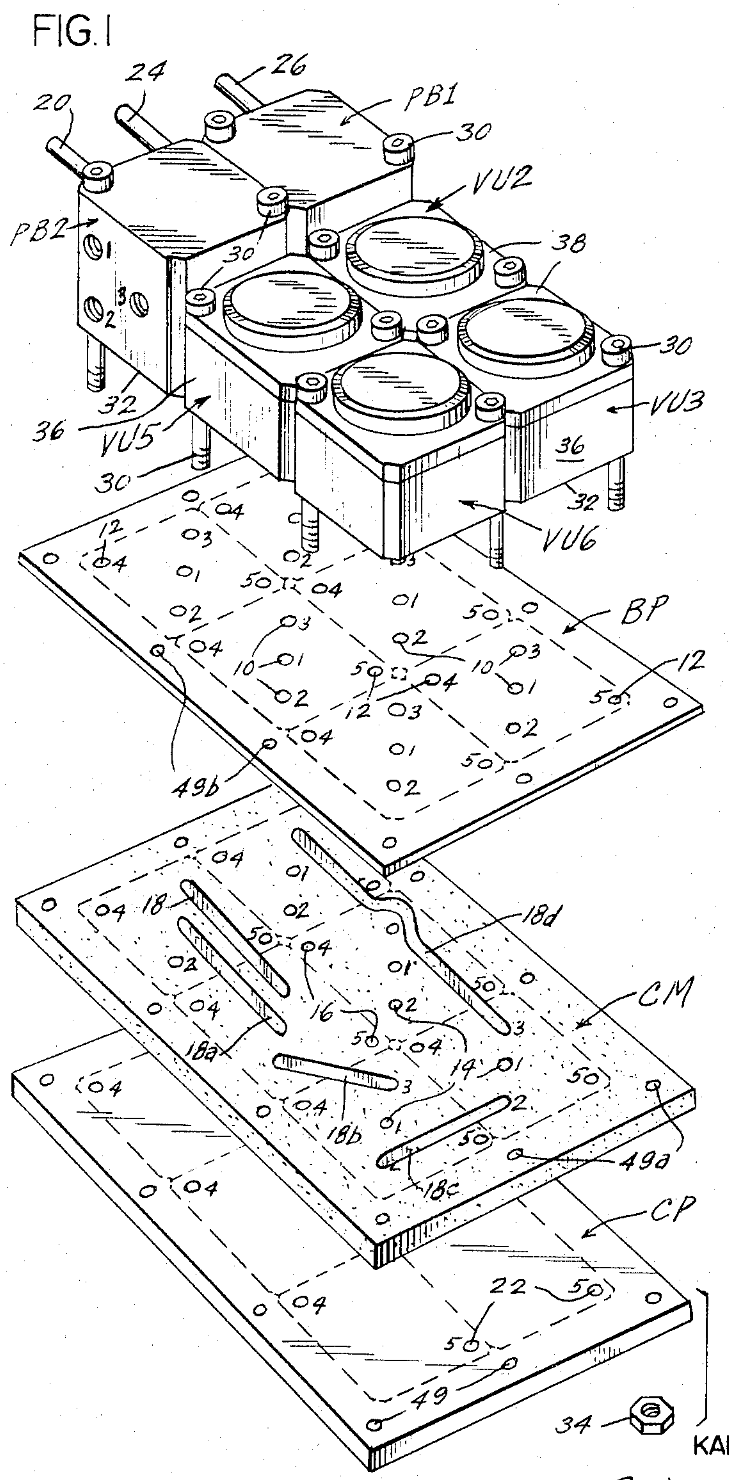
FIG. 1 is an exploded perspective view of a representative stack of elements constituting my fluid logic circuit mechanism and comprising specifically a plurality of valve units, a pair of circuit porting blocks, a base plate, a circuit module and a cover plate.

In FIGS. 1, 9 and 10 valve units VU2, VU3, VU5, and VU6 are shown, and a pair of porting blocks PB1, and PB2. The base plate BP as shown in FIG. 1 is illustrated as of a size for six valve units, the outlines and divisions between valve units being indicated by dash lines 13. For each valve unit and/or porting block there are five perforations in the base plate which may be numbered directly on the base plate itself such as 1, 2, 3, 4 and 5. The perforations 1, 2 and 3 are indicated 10 (base plate fluid connection perforations). The perforations 4 and 5 are indicated 12 (base plate clamp screw perforations).

The control module CM likewise has five perforations for each valve unit and/or porting block similarly numbered 1 through 5. The perforations 1, 2 and 3 are numbered 14 (control module fluid connection perforations). The perforations 4 and 5 are numbered 16 (control module clamp screw perforations). Certain of the perforations 14 are connected by circuit moduple lateral fluid connection slots 18, 18*a*, 18*b*, 18*c* and 18*d*. The control module CM is supplied in suitable unit size (such as the six-unit size illustrated) and with the five openings 14 and 16 for each valve unit and/or porting block to be mounted on the base plate BP. These openings 14 and 16, of course, are in alignment with the five openings 10 and 12 in the base plate for each unit and porting block, and at the time of assembly of a complete valve unit-circuit board assembly, the proper openings 14 of different valve units may be connected by cutting the slots 18, 18*a*, etc., as required.

The cover plate CP is illustrated as having cover plate clamp screw perforations 22 already formed and mounting screw perforations 49 around its periphery. The elements CM and BP have matching mounting screw perforations 49*a* and 49*b* respectively. Three outside fluid connections are illustrated by way of example (tubes 20, 24 and 26, FIG. 9) to the porting blocks PB1 and PB2. The tube 20 is connected by the slot 18*a* to port 1 of the valve unit VU5 as represented in FIG. 9 while the tubes 24 and 26 are connected to the port 3 of valve unit VU5 and the port 3 of valve unit VU3 by slots 18 and 18*d* respectively in the control module CM.

Means are provided for clamping the entire assembly of valve units and/or porting blocks, base plate, control module and cover plate together such as threaded studs or bolts 30 extending from the valve units and porting blocks and through all the perforations numbered 4 and 5 of the plates and control module. On the lower ends of the studs or bolts clamp nuts 34 are screwed. Thus, the base plate is held in intimate contact with the lower surfaces 32 of the valve units and/or porting blocks (which surfaces are in a common plane) and the control module CM is held in compression between the plate BP surmounted by the valve units and/or porting blocks and the plate CP. The control module thus serves both as a seal between the two plates and as a means to provide interconnecting fluid passageways between desired No. 1, No. 2 and No. 3 ports of the various valve units and porting blocks. The valve units and porting blocks may be sealed to the plate BP by the use of ring seals 40 such as O-rings as shown in FIG. 10.

FIG. 10 also shows the plates BP and CP, and the control module CM extended the distance indicated 46 for the purpose of providing anchorage to a control panel or the like shown at 48, mounting screws 50 being used to mount the assembly on the control panel and spacers 44 being provided to clear the lower ends of the bolts or screws 30 with respect to the panel. The valve units may be designed to perform various logic functions, such as the one shown in FIG. 10 which performs the logic function OR as shown in my copending application Ser. No. 513,215, filed Dec. 13, 1965, and which is a double check valve of specific configuration. The ports numbered 1 and 2 are inputs and the port 3 is an output. The input 1 has a valve seat 41 and the input 2 has a valve seat 43, a diaphragm 42 of rubber-like material normally seating against both when there is no flow to either input. When there is flow to input No. 1 (from tube 20) the diaphragm 42 will open with respect to the seat 41 and there will be output flow through No. 3, slot 18 and tube 24. When there is input from No. 2 (lateral slot 18*b*) the diaphragm 42 will be forced away from the seat 43 and there will again be output flow through No. 3. Thus, the double check valve shown performs the logic function OR. Each valve unit comprises a body 36 and a cover 38 as shown suitably designed for the two inputs and the single output.

Similarly, and AND logic function can be accomplished by a 3-way normally closed valve having two inputs and one output, a NOT logic function can be accomplished by a 3-way, normally open valve, a NAND logic function can be accomplished by an OR valve plus a NOT valve. A MEMORY logic function can be performed by a 3-way, normally closed valve with retaining feature, and a FLIP-FLOP logic function by two OR plus two NOT valves. Other logic element types of valves with appropriate valve functions can be provided for DIFFERENTIATOR, TIME DELAY and the like. The TIME DELAY valve, for instance, may be provided by a pneumatic timer valve unit plus an AND or a NOT unit wherein the two are in series with each other and the interconnection between the one and the other is by way of a lateral slot in the control module CM.

In the foregoing specification it will be obvious that I have provided a flexible fluid logic circuit mechanism that can be readily assembled to perform various logic functions in series or parallel or in any other desired combination with a minimum of piping, the only required piping being that extending to and from the logic circuit mechanism assembly. The arrangement is such that it may readily fit the requirements of binary logic having the logic functions defined by presence or absence of fluid pressure. While I have indicated pneumatic pressure, it is also possible to use the mechanism for hydraulic pressure and the disclosed mechanism is accordingly quite versatile and adaptable for use in many diversified systems using the disclosed basic assembly of base plate, cover plate, control module valve units and porting block herein illustrated by way of example.

An inspection of FIG. 1 shows a recurring pattern of fluid connection perforations 10 in the base plate BP and 14 in the control module CM. Six such patterns are shown, two of which are aligned in one direction, two of which are aligned with the first two but in a direction lateral to such one direction and the other two of which are aligned with the first two and likewise in said direction lateral to such one direction. Obviously, this pattern may be repeated as many times as necessary for complex installations, and each pattern is capable of having a valve unit or porting block mounted thereon. The valve units and porting blocks can be of various types and placed in selected positions because of such recurring pattern, the positions being selected in accordance with the requirements for the fluid controlling slots 18 cut into the control module CM. This arrangement of recurring patterns permits great flexibility in laying out and fabricating a fluid logic circuit assembly and permits a ready change of types of valve units and porting blocks, and positions thereof, to improve the fluid circuit arrangement by cutting new control modules, and otherwise facilitates the fabrication of a complete operating unit for a given purpose.

FIGS. 2, 3 and 4 show how the passageways are arranged in the porting block PB1 (or PB2) so that connections can be made to either of two faces of the block depending on its position on the base plate BP. Whenever any port in the block connects with a perforation 1, 2 or 3 of the control module which is not fluidically connected by a slot 18 in the circuit, the port of the block need not be plugged. On the other hand, since there are two ports at two side faces of the block connected to a port in the lower surface 32 of the block, when a circuit is made to one of the ports the other one must be plugged to prevent leakage of the fluid.

The circuit porting block PB3 in FIG. 5 has top porting and an internal passageway arrangement for connecting its top port 52 to all three ports 1, 2 and 3 in the bottom surface 32. The passageway bears reference numeral 54.

A porting block PB4 is shown in FIG. 7 which may be termed a "cross-over" block, accomplished by means of a passageway 56 connecting the bottom ports 2 and 3 together. In FIG. 8 an "orifice" block is shown in which an orifice 58 connects the bottom ports 1 and 2 and an orifice 60 connects the bottom ports 1 and 3. Thus, various arrangements of porting blocks may be provided for different circuit installations and the porting blocks PB3, PB4, and PB5 are merely examples.

FIG. 11 shows symbolically a pair of the valve units of the type shown at VU5 in FIG. 10 (OR valves) and the connections to them and between as shown in FIG. 9, a supply pipe 28 being shown for the port 1 of the valve VU6.

Some changes may be made in the construction and arrangement of the parts of my fluid logic circuit mechanism without departing from the real spirit and purpose of my invention, and it is may intention to cover by my claims any modified forms of structure or use of mechanical equivalents which may reasonably be included within their scope.

I claim as my invention:

1. In a fluid logic circuit mechanism, an assembly comprising a plurality of valve units and porting blocks having base surfaces in a common plane, a base plate against said base surfaces, a flat circuit module against said base plate and a cover plate against said circuit control module, means for holding said valve units, said porting blocks, said base plate, said circuit control module and said cover plate in assembled stacked fluid tight relationship, said valve units and porting blocks having fluid passageways terminating at said base surfaces, said base plate having a complete pattern of spaced fluid connection perforations, some of which are aligned with said fluid passageways of said valve units and said porting blocks, said circuit control module having a complete pattern of spaced fluid connection perforations aligned with said fluid connection perforations of said base plate, said circuit control module also having fluid conducting slots extending from surface to surface thereof whose ends terminate at certain of said circuit control module perforations and which serve as lateral fluid connections between said fluid passageways of said valve units and said porting blocks, and corresponding perforations of said base plate, and fluid conducting means communicating with said porting blocks and thereby through certain of said circuit control module perforations and corresponding perforations of said base plate with only those fluid passageways of said valve units required to receive fluid from and deliver fluid to sources outside of said assembly.

2. A fluid logic circuit mechanism according to claim 1 wherein said valve units and porting blocks have ring seals coacting with said base plate at the ends of and surrounding said fluid passageways of said valve units and said porting blocks adjacent said base plate.

3. A fluid logic circuit mechanism according to claim 1 wherein said means for holding comprises at least two clamp screws for each valve unit and porting block, said clamp screws extending through said base plate, said circuit control module and said cover plate, and said circuit control module being resilient for sealing engagement with said base plate and said cover plate.

4. A fluid logic circuit mechanism according to claim 1 wherein said circuit control module is of readily cut material for facilitating the formation of said fluid conducting slots depending upon requirements for a given circuit board assembly.

5. A fluid logic circuit mechanism according to claim 3 wherein registering perforations are provided in said base plate, said circuit control module and said cover plate for said clamp screws.

6. A fluid logic circuit mechanism according to claim 3 wherein said base plate is relatively thin for flexibility and said cover plate is relatively heavy to act as a rigid base for said circuit control module, said base plate, said valve units and said porting blocks.

7. An assembly for use in a fluid logic circuit mechanism comprising a base plate, a control module against said base plate and a cover plate against said control module, means for holding said base plate, said control module and said cover plate in assembled stacked fluid tight relationship, said base plate having a full pattern of fluid connection perforations for fluid passageways of fluid logic valve units and porting blocks, said control module having a full pattern of fluid connection perforations aligned with said base plate perforations and fluid conducting slots extending in the plane of said control module whose ends are aligned with certain perforations of said base plate and serve as lateral fluid connections between various of said base plate perforations, said porting blocks having passageways communicating with only those perforations of said base plate required to receive fluid from and deliver fluid to sources outside of said assembly, and fluid conducting pipes communicating through said passageways of said porting blocks with said last mentioned perforations of said base plate.

8. A fluid logic circuit mechanism according to claim 7 wherein said means for holding comprises cap screws extending, some through said valve units, said base plate, said control module and said cover plate, and others through said porting blocks, said base plate, said control module and said cover plate.

References Cited

UNITED STATES PATENTS

| | | | |
|---|---|---|---|
| 3,025,879 | 3/1962 | Hupp | 137—608 |
| 3,225,779 | 12/1965 | Lootzook | 137—81.5 |
| 3,244,193 | 4/1966 | Loveless | 137—608 |
| 3,094,144 | 6/1963 | Oxley | 251—367 XR |

OTHER REFERENCES

Steiner: Universal Modular System for Pneumatic Switching Controls, July 1964, 11 Process Control and Automation 7, pp. 310–312.

WILLLIAM F. O'DEA, *Primary Examiner.*

H. COHN, *Assistant Examiner.*